(12) United States Patent
Luettgens et al.

(10) Patent No.: US 7,642,707 B2
(45) Date of Patent: Jan. 5, 2010

(54) ELECTROLUMINESCENT DEVICE WITH A LIGHT CONVERSION ELEMENT

(75) Inventors: Gunnar Luettgens, Aachen (DE); Albrecht Kraus, Kerkrade (NL); Benno Spinger, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 119 days.

(21) Appl. No.: 12/064,100

(22) PCT Filed: Aug. 14, 2006

(86) PCT No.: PCT/IB2006/052798
§ 371 (c)(1),
(2), (4) Date: Feb. 19, 2008

(87) PCT Pub. No.: WO2007/023412
PCT Pub. Date: Mar. 1, 2007

(65) Prior Publication Data
US 2008/0232085 A1   Sep. 25, 2008

(30) Foreign Application Priority Data
Aug. 24, 2005   (EP) .................................. 05107762

(51) Int. Cl.
*H01J 5/50* (2006.01)
(52) U.S. Cl. ....................... 313/501; 313/502; 313/512; 257/98; 257/100; 362/84
(58) Field of Classification Search ................ 362/235, 362/84, 800; 313/502, 503, 512; 257/88, 257/89, 98, 100
See application file for complete search history.

(56) References Cited

U.S. PATENT DOCUMENTS

| 3,875,456 | A  | * | 4/1975 | Kano et al. .................. 313/501 |
| 5,955,837 | A  | * | 9/1999 | Horikx et al. ............... 313/506 |
| 6,653,765 | B1 | * | 11/2003 | Levinson et al. ............ 313/112 |
| 7,118,438 | B2 | * | 10/2006 | Ouderkirk et al. ............. 445/24 |
| 7,192,161 | B1 | * | 3/2007 | Cleaver et al. .............. 362/260 |
| 7,245,072 | B2 | * | 7/2007 | Ouderkirk et al. ........... 313/502 |
| 7,312,560 | B2 | * | 12/2007 | Ouderkirk et al. ........... 313/113 |
| 7,394,188 | B2 | * | 7/2008 | Ouderkirk et al. ........... 313/110 |
| 7,462,983 | B2 | * | 12/2008 | Baroky et al. ............... 313/503 |
| 2003/0038295 | A1 | | 2/2003 | Koda |
| 2004/0124430 | A1 | | 7/2004 | Yano et al. |
| 2004/0257797 | A1 | | 12/2004 | Suehiro et al. |

FOREIGN PATENT DOCUMENTS

| EP | 0977278 A2 | 2/2000 |
| EP | 1403934 A2 | 3/2004 |

(Continued)

*Primary Examiner*—Ali Alavi
(74) *Attorney, Agent, or Firm*—Azir U. Haque

(57) ABSTRACT

The invention relates to a light source to emit a mixture of primary and secondary light comprising an electroluminescent device like a light emitting diode LED or a laser, to emit the primary light into a light conversion element (3) to convert the primary light into the secondary light, where a first part of the primary light is emitted along a light path with a first conversion factor (11) for the primary light, and a second part of the primary light is emitted along a light path with a second conversion factor (12) for the primary light larger than the first conversion factor.

13 Claims, 3 Drawing Sheets

FOREIGN PATENT DOCUMENTS

Figure 1:
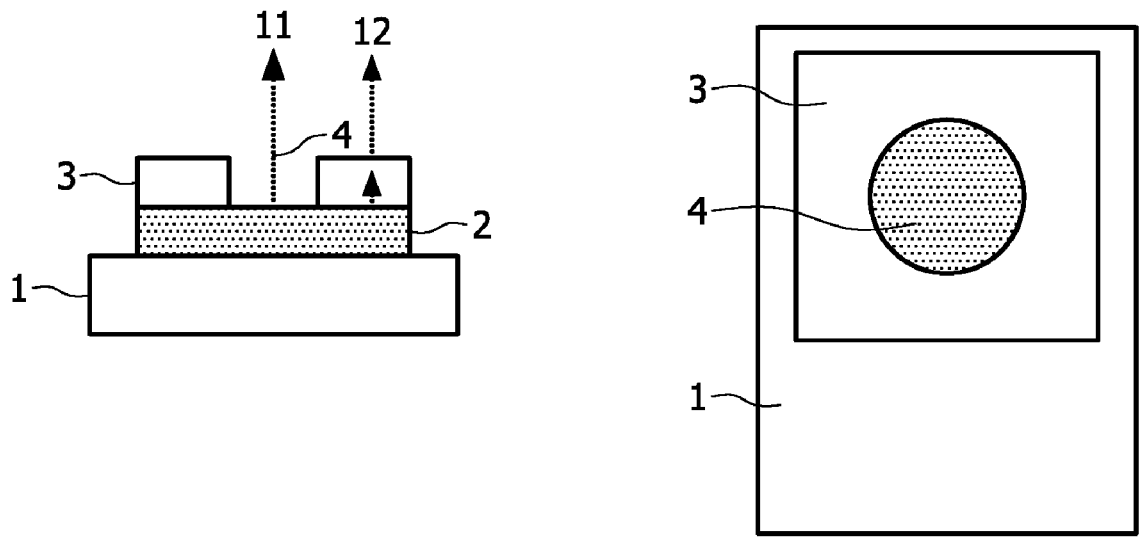

| | | | |
|---|---|---|---|
| EP | 1605526 | A2 | 12/2005 |
| EP | 1643567 | A2 | 4/2006 |
| JP | 2004349647 | A | 12/2004 |
| WO | 0165613 | A1 | 9/2001 |
| WO | 0169692 | A1 | 9/2001 |

* cited by examiner

ELECTROLUMINESCENT DEVICE WITH A LIGHT CONVERSION ELEMENT

The invention relates to a light source to emit a mixture of primary and secondary light comprising an electroluminescent device like a light emitting diode LED or a laser.

Many light emitting diodes (LEDs) that emit white light are made of an LED semi-conductor corpus named "die", which emits blue light, and a phosphor portion as conversion element, which is arranged above the LED emitting surface, in order to convert the pump light into yellow light by active phosphor light absorption. Because this conversion is not very efficient, being only a fraction less than 100%, the light emitted as a result is a color mixed white light. Thus, white light is generated by superimposing the blue light leaking through the phosphor and the yellow light. One problem of a phosphor-coated white LED is that the peak of the wavelength of the blue die is not always the same, but differs from die to die. Both absorption and conversion efficiency of the phosphoric layer keep changing, depending on the wavelength of the stimulating or pumping light. The problem is caused by imperfections in the manufacturing process.

Therefore, the different wavelengths of the blue die lead to different amounts of yellow light generated at different pump wavelengths, resulting in different colour temperatures of the white light. So as a result, the colour temperatures of mass-produced LEDs are not identical but differ from one to the other.

LEDs having the above features are well known in the state of the art. A method is known from JP 2004-349647 to mount a light-emitting device onto a substrate that pumps or loads the device itself. This arrangement is covered by a colour conversion material containing optical absorbers and/or phosphors and a kind of optical lens on top of it.

LEDs of this kind have one problem. The peak wavelength of the blue light of the light emitting semi-conductor die is not stable in production as already mentioned above. This occurs because of different peak wavelengths in each die.

It is an object of the invention to improve the light source of the kind already mentioned, so that variations in colour temperature that are caused by production can be decreased.

This object is realized by a light source to emit a mixture of primary and secondary light comprising an electroluminescent device like a light emitting diode LED or a laser to emit the primary light, a light converting element to convert the primary light into the secondary light, in which a first part of the primary light is emitted along a light path with a first conversion factor for the primary light and a second part of the primary light is emitted along a light path with a second conversion factor for the primary light larger than the first conversion factor. By this, a mixed light is generated where the colour temperature essentially depends on the ratio between the first and the second part of the primary light. In so doing, the variation of peak wavelengths of the primary light from electroluminescent device to electroluminescent device and the consequent but undesirable variations of the light conversion process between different produced light sources are minimized.

A first embodiment of the invention is, that the first conversion factor for primary light is 0. Here a stable amount (first part) of the primary light is directly emitted without conversion from the semiconductor die independently from the wavelength of the primary light.

A further embodiment of the invention is that the second conversion factor for the primary light is larger than 0.9. This means that primary light will be effectively, i.e. 90% or more, converted into secondary light. This can advantageously also be realized in combination with aforesaid embodiment, so that a first conversion factor of 0 and a second conversion factor of more than 0.9 for primary light can be used in common on one light source comprising a conversion element.

The thickness and/or phosphor concentration in the conversion element or layer are so high that the blue light is nearly completely converted for example into yellow light, that means there is nearly no primary light or less than 10% of the primary light leaking through the phosphoric conversion element.

To realize these functional features, different structural features are claimed and disclosed. A form of an embodiment is that the area of the conversion element with a conversion factor greater than 0.9 is physically smaller than the light-active surface of the semi-conductor corpus. So a definite amount of unconverted original pump-wavelength light, i.e. primary light, can be emitted (first part of the primary light). The thickness and phosphor concentration of the phosphor layer are so high that nearly all the primary light going through the conversion element is converted, that means there is nearly no leakage light (second part of the primary light).

In another embodiment of the light source the first part of the primary light is coupled into at least a first area of the converting element and the second part of the primary light is coupled into at least a second area of the converting element. Such first areas can be defined as areas not covered by the conversion element, such as openings or uncovered areas. Bulk areas produced in the conversion element, with very low phosphor concentration are also possible. The primary light generated under the closed conversion layer area will completely go through the conversion layer bulk, and with high concentration of, e.g., phosphor, this light will be converted, e.g., into yellow light. This effect could also be caused by definite low and high concentration areas of conversion-inducing chemical elements.

Another possible form of the embodiment mentioned above is to arrange at least one opening in the conversion layer so that the first part of the primary light will physically pass without conversion, and the definite second part will be efficiently or nearly completely converted by high phosphor concentration, or any other photo-luminescent element.

The conversion layer could also have a definite pattern of openings, which could in another form of embodiment also be structured as a pattern of small crosses. These openings or pattern can also be realized by intrinsic concentration areas in the sense of the invention, which means defined regions or pattern of low phosphor concentration. This means that the conversion element can have real openings, and that these regions can also be realized by areas of transparent material. Such regular patterns cause a better mixing result of primary and secondary light.

This could also be advantageous for LED arrays in which a number of LEDs are arranged on a common substrate.

In an embodiment already described above, regular patterns of first areas are advantageous, especially with cross-like slits, because they cause very good light mixing of primary and secondary light.

A further embodiment is characterized in that the primary light comprises blue light. Blue light can be converted into all other visible colours.

So in a further advantageous embodiment of the invention, the secondary light comprises light from a first and a second spectral range. The colour properties, such as colour rendering index, can be improved by mixing more than two colours.

Another preferred embodiment is that the conversion element comprises a dichromatic coating on its external surface in order to reflect primary light partly into the conversion-active bulk of the conversion element. A dichromatic coating causes a wavelength-dependent dispersion of light. In this the dichromatic coating is a very thin layer of, for example, metal, the size of which will mean that the above effect will be caused.

In so doing, unconverted primary light can be reused for conversion. As a result, light conversion becomes more efficient. Again, the colour temperature of the emitted light depends on the geometry of die and phosphor layer, not on the exact primary light wavelength.

The correlation between the thickness of dichromatic layers and the wavelength on which it is applied is well known. However, the use in this technical context of the disclosed invention provides an advantageous embodiment. External surface is in this context the outer surface of the conversion layer through which at least the secondary light will be emitted.

A further embodiment is that the conversion layer comprises an absorption coating on its external surface in order to absorb the primary light partly. This is a further possibility of excluding primary light emission. This also keeps the amount of primary light stable, which is needed for the light mixture. These coatings can be used in addition to the features described above.

One form of combination of the above embodiments of the invention is the use of blue primary light. The conversion layer features a high concentration of phosphor so that the conversion light in this example is yellow. This is used to produce a light colour mixture showing white light as a result. Using these disclosed features, it is possible to manufacture white light LEDs having a very stable colour temperature. In the same functional meaning it produces a light-colour-stable emitted light in all possible emitted light colours actually be generated by LEDs.

Another aspect is that LED constructions can be applied, which carry the electrical contact wires of the semiconductor pump-light corpus, together located on the side adjacent to the light-emitting side. This LED construction can easily be used. For the use of LED constructions with electrical contact wires that are located on different sides of the pump-light corpus, it is very advantageous that at least one of the electrical contact wires is led through an opening in the conversion layer. In this context the openings have a double function. One serves for a stable light conversion and the other for the installation of the wires for the application of wire-bonded LEDs.

Light emitting diodes can be used, where the electrical contact wires are located on different sides of the pump-light corpus, so that at least one of the electrical contact wires is led through an opening in the conversion layer.

An advantageous embodiment is that several LED light sources of this type can be arranged in arrays.

LEDs can be also used with electrical wires, which are both located on the side that is adjacent to the light emitting side. So contacting can easily be realized on the bottom.

A further embodiment is that several electroluminescent devices are arranged in arrays, as already described in combination with the above features of special conversion element embodiments.

A further embodiment is an arrangement made of at least one LED light source and an optical element mixing the light emitted from different points of the surface of the LED light source or emitted in different directions, and redistributing the emitted light in the desired directions.

The optical element can be a mixing rod made of transparent material or a collimator or a lens.

The use of the invention is advantageous for inorganic as well as for organic LEDs. Lasers, e.g. laser diodes as light sources in the sense of the invention can also be used.

The conversion layer must not generally be fixed directly to the semi-conductor corpus, but can also be coupled optically to the semi-conductor corpus by light transmission fibres or light transmission means.

These and other aspects of the invention will be apparent from and elucidated with reference to the embodiments described below.

The drawings show the following:

FIG. 1: Side and top view of a light source according to the invention

Figure 2:
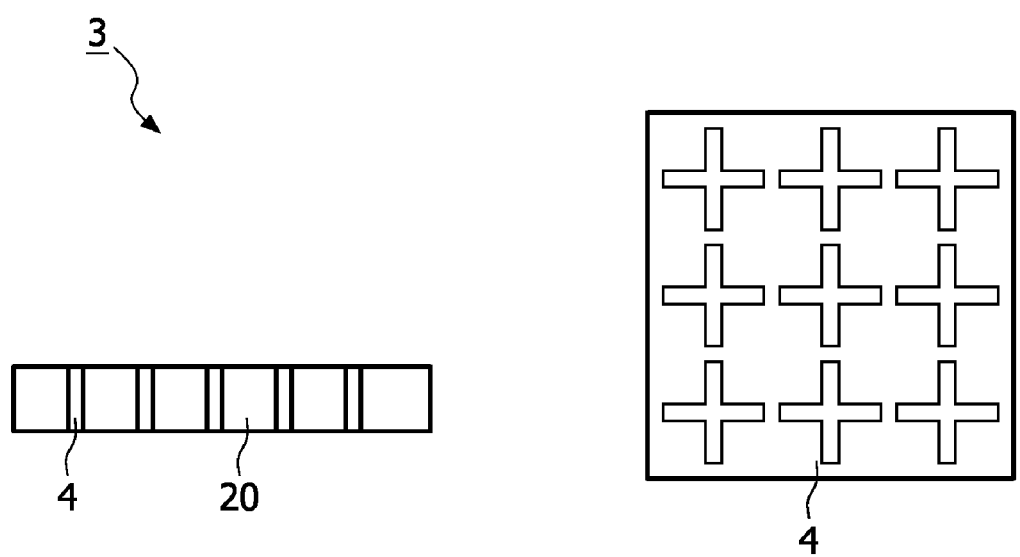

FIG. 2: Side and top views of the conversion layer comprising slits

Figure 3:
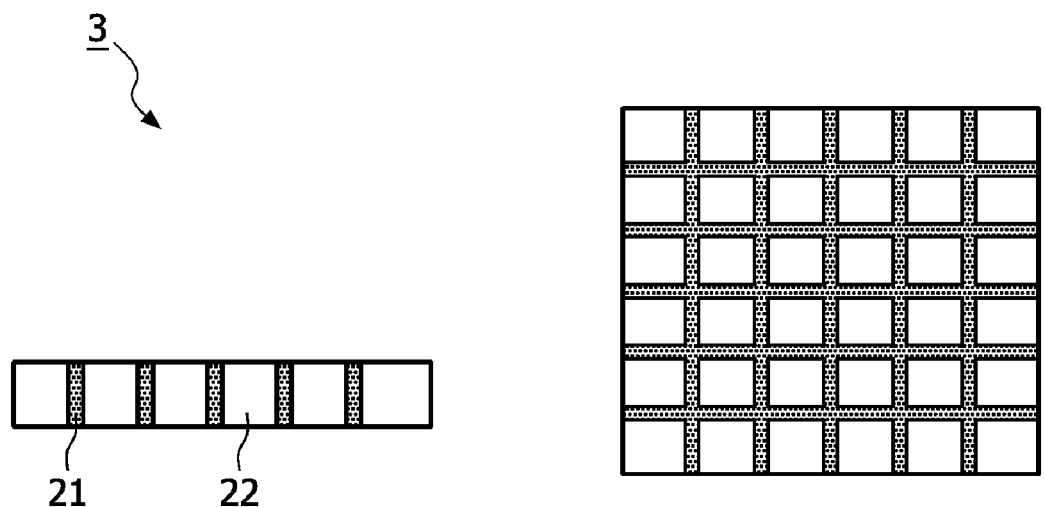

FIG. 3: Side and top view of the conversion layer with intrinsic non-conversion areas FIG. 4: Side and top view of another light source according to the invention FIG. 5: Side view of an embodiment of the light source with a dichromatic coating FIG. 6: Side view of an embodiment of the light source with an absorption coating FIG. 7: Side view of an embodiment with bonded LED FIG. 1 shows an embodiment of the invention. The left-hand part of the picture shows the side of a cross-section. A light-emitting semi-conductor corpus 2 emitting light, e.g. blue light, as primary colour, is fixed or mounted onto a substrate 1. Light emission will be caused upwards. A phosphor ceramic platelet or conversion element 3 is arranged on top of the primary light-emitting surface of the semiconductor corpus. This generates secondary light, e.g. yellow light, by conversion of the primary light 12. This is a physical process by which the primary light of definite wavelength activates electrons in the phosphor taken into a higher energy level. An effect is used called photoluminescence because of quantisation of energy levels in the phosphor atoms. In this particular effect of blue colour pumped phosphor, the electrons are pumped onto higher energy levels, from which they cannot relax or recombine directly because of quantisation rules. The "pumped" electrons therefore have to relax in steps by non-radiating and radiating energy level relaxation. The resulting non-radiating relaxation will cause no light emission, but does eliminate a part of the energy. The final radiating relaxation therefore occurs in another part of the energy. This means it will be shifted from blue to a lower energy, for example yellow. This light wavelength shift will be very exact due to the very precise nature of quantisation because of a stable concentration of phosphor over the bulk of conversion layer.

There can be lens bodies or discs, not shown here, above this vertical structure in which the light colours will be mixed into mixed light, e.g. white light.

Blue primary light can be emitted through the definite opening 4 in the ceramic plate, without conversion, and represents a stable amount (first part) of the primary light 11. The other part (second part) of the primary light is converted into yellow light 12 and will then be mixed with the unconverted directly emitted blue light into the secondary light.

The right side of FIG. 1 shows the structure from the top. Here the proportions of the substrate 1, the primary light emitting semi-conductor corpus 2 and the relative dimensions of the opening 4 in the conversion layer 3 can be seen.

FIG. 2 shows a side view and a top view of the conversion layer 3. The left-hand side shows a cross-sectional side view of the conversion layer, where a regular pattern of openings 4 is shown equidistant from each other. The right-hand side of FIG. 2 shows the top view of the conversion layer, in which a special embodiment is shown. The openings 4 are holes, slits, and crosses in a regular pattern. This arrangement is preferred to obtain a more homogeneous distribution of the colour temperature of light emitted in different directions. Such a conversion layer construction can be used for single LEDs and also very advantageously for LED-arrays. The pumping primary light will therefore emit through these openings without conversion and will then be mixed with the converted light resulting in white light.

FIG. 3 shows another embodiment, by which the partially unconverted pumping primary light will emit through a kind of intrinsic optic holes 21 where the phosphoric concentration is locally zero or near zero. This means that the conversion layer 3 does not have physical holes or slits. The conversion layer 3 does not have physical holes or slits, but it has both intrinsic regions of high phosphor concentration 22 and regions with no phosphor like the intrinsic optic holes 21. The regions having no phosphor act like optical holes through which blue light can escape unconverted. Such discrete concentration gradients could be produced by manufacturing such layers, for example, by using masks during vapour or liquid phase epitaxy. In other words, the parts having no phosphor are permeable to blue light. In the other areas, the phosphor concentration is so high that nearly all the blue light is converted into yellow light. These areas are almost non-permeable to blue light. The phosphor concentration is so high that even if the wavelength of the blue light did not meet the absorption maximum of the phosphor, overall conversion is nearly 100%. Thus the colour of the emitted white light does not depend on the exact wavelength of the blue light any more, but is determined by the geometry of the phosphor ceramic structure and the portion of transmitting and highly absorbing areas respectively. This form of embodiment therefore provides a very elegant realisation of the invention.

Figure 4:
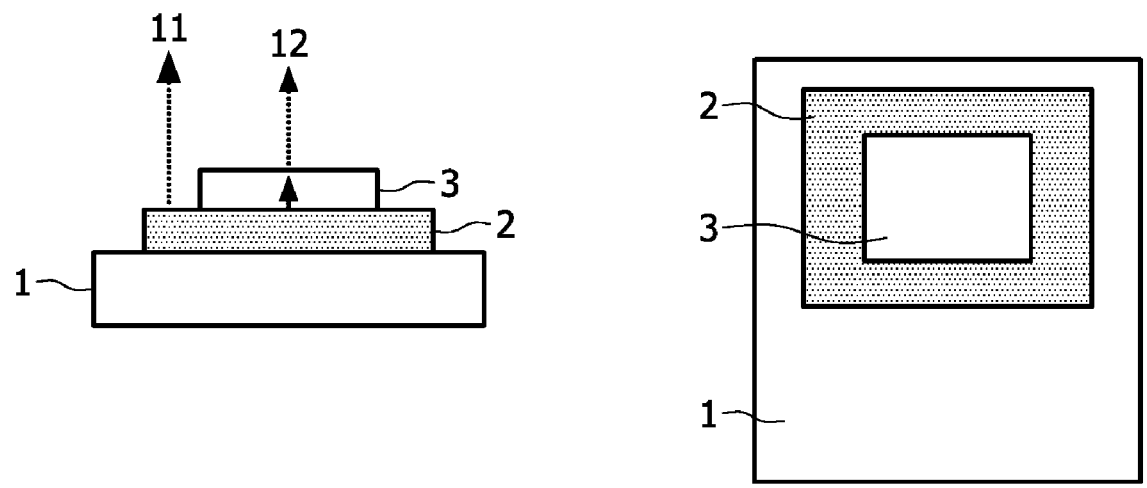

FIG. 4 shows an embodiment in which the vertical structure of substrate 1 and semi-conductor corpus 2 and ceramic phosphor platelet 3 is nearly equal to the arrangement of FIG. 1. However, the ceramic phosphor platelet 3 as conversion layer does not cover the complete light-active surface of the semi-conductor corpus 2. Pump-wavelength light, i.e. the first part of the primary light 11, can be emitted at the sidelines of the semi-conductor corpus 2 without going through the conversion layer 3, i.e. the ceramic phosphor platelet. The second part of the emitted pump-wavelength light passes through the ceramic phosphor platelet, i.e. the conversion layer, so that this amount of pump-wavelength light will be converted into yellow light 12 by luminescent absorption. These two light colours will be mixed above(?) to give white light. The right-hand side of FIG. 4 shows the top view on top of the vertical structure shown in the left-hand side of FIG. 4. The overlap of the several layers 2 and 3 is clearly visible here.

Figure 5:
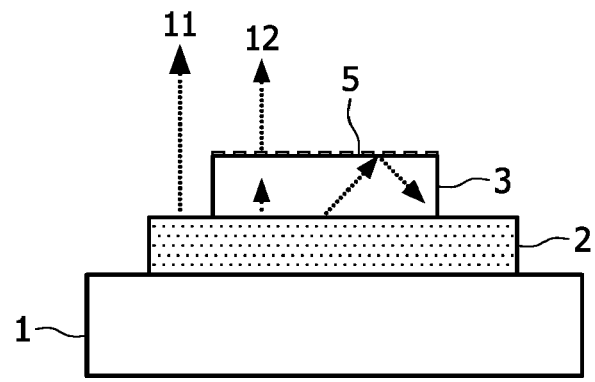

FIG. 5 shows an embodiment of the invention, in which the outer surface of the conversion layer 3, i.e. the ceramic phosphor platelet, is coated with a dichromatic coating 5, in addition to the structure in FIG. 4, to reflect the unconverted pump-wavelength light back into the bulk of the conversion layer, in order to reuse it for the conversion process. The conversion layer 3 is transparent to the converted light wavelength. This means that only the wavelength of the pump-wavelength light will be reflected. Thus, the emission of converted light through the surface of the conversion layer is effectively high. On the base of the same geometry of the structure as in FIG. 4, an amount of pump-wavelength light will be emitted beside the conversion layer 3, so that above the structure the mixing of the two light colours can generate an emission of white light as a result. The use of a dichromatic layer is advantageous if the LED is operated at primary light intensities temporarily causing colour conversion saturation of the conversion layer.

Figure 6:
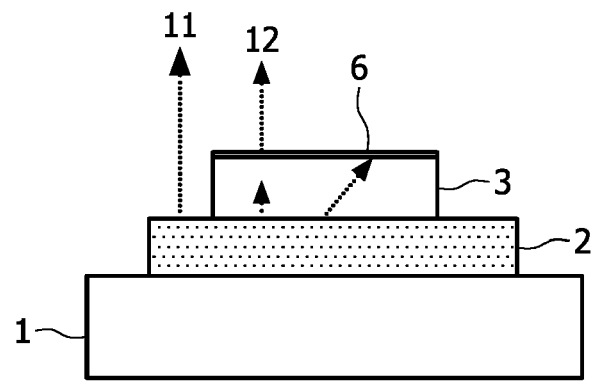

FIG. 6 shows an alternative to the embodiment of FIG. 5 using the same structure as in FIGS. 4 and 5 of the layer geometry. However, the coating of the outer surface of the conversion layer is an absorption coating 6, which absorbs the primary light that has not been converted in the bulk of the conversion layer 3 because of poor cross-section of the effectiveness of pump light that has, e.g., not been emitted exactly at the peak-wavelength. The conversion process could not be initiated effectively because of a slight shift in the wavelength of the pumping primary light. By the use of an absorption coating 6, however, this small amount of remaining primary light within the light leaving the conversion element can be filtered out. As a result, only converted light will be emitted through the surface of the conversion layer, which will be mixed into white light with the laterally directly emitted amount of pump-light above the structure.

In the structures shown in FIGS. 1 to 6, LEDs or semi-conductor corpora are used having electrical contacts arranged on one side of the semi-conductor corpus. LEDs like this have a flip chip geometry.

Figure 7:
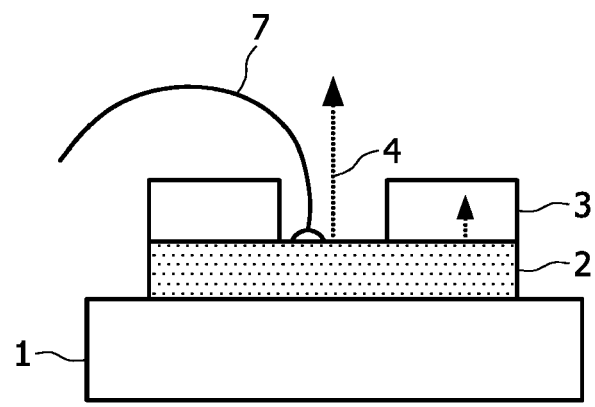

FIG. 7 shows an embodiment in which a structure as in FIG. 1 is used. A wire-bonded LED is used in this embodiment. Contrary to flip chip LEDs, the electrical contacts are realized by wires arranged on different sides of the semi-conductor corpus. For this, the upper wire 7 could preferably be arranged through the opening 4 or one of the openings of the conversion layer 3, i.e. the ceramic phosphor platelet. Such openings could be similar to those shown in FIG. 1 or 2. An advantageous combination of wire arrangement and efficient light mixture can thus be caused.

The proposed arrangements in all embodiments are not restricted to white light LEDs, but can also be used for other LED/conversion element combinations. Furthermore, the surface ratio of the different structures can be used to adjust the colour of the emitted light.

The thickness of the phosphor ceramic platelet, i.e., the conversion layer, needs to be small compared to the lateral dimensions of the LED die, or semi-conductor corpus, in order to minimize disturbing effects occurring at the edges of the platelet.

Great care has to be taken to achieve a constant colour temperature that is emitted in different directions. Phosphor ceramic platelets with cross-formed slits as shown in FIG. 2 are preferred to obtain a more homogeneous distribution of colour temperatures. However, a perfect correction will not be possible. Light of different colour temperatures will be emitted in different directions, but this does not need to be a problem if mixing optics, for example collimators, are used.

The embodiment in which the phosphor ceramic platelet or the phosphor covers only a part of the semi-conductor corpus surface is a special embodiment of the invention described above with high phosphor concentrations. However, this is not limited to high phosphor concentrations, as this arrangement can be used to achieve colours by mixing the light coming from the semi-conductor surface and the light emitted by the phosphor in a very simple way—even if the phosphor conversion is low—just by choosing a phosphor ceramic platelet of the right size.

The invention claimed is:

1. A light source to emit a mixture of primary and secondary light comprising an electroluminescent device like a light emitting diode LED or a laser to emit the primary light, a light conversion element (3) to convert the primary light into the secondary light, wherein a first part of the primary light is emitted along a light path with a first conversion factor (11) for the primary light and a second part of the primary light is emitted along a light path with a second conversion factor (12) for the primary light larger than the first conversion factor, wherein the first part of the primary light is coupled into at least one first area (4) of the conversion element (3) and the second part of the primary light is coupled into at least a second area of the conversion element (3), and wherein the conversion element (3) comprises a regular pattern of equidistant first areas (4), and/or the first area (4) has a shape of a cross-like slit in light emitting direction (12).

2. A light source according to claim 1, characterized in that the first conversion factor for the primary light is 0.

3. A light source according to claim 1, in that the second conversion factor for primary light is larger than 0,9.

4. A light source according to claim 1, characterized in that the conversion element (3) comprises a regular pattern of first areas (4).

5. A light source according to claim 1, characterized in that the secondary light comprises light from a first and a second spectral range.

6. A light source according to claim 1, characterized in that the primary light comprises blue light.

7. A light source according to claim 1, characterized in that the conversion element (3) comprises a dichromatic coating (5) on its external surface in order to reflect primary light at least partly back into the conversion element (3).

8. A light source according to claim 1, characterized in that the conversion layer (3) comprises an absorption coating (6) on its external surface in order to absorb the primary light passing through the conversion element (3) at least partly.

9. A light source according to claim 1, characterized in that one or more electrical contact wires of the electroluminescent device are located together on a side adjacent to the light emitting side.

10. A light source according to claim 1, characterized in that the electrical contact wires are located on different sides of the electroluminescent device, so that at least one of the electrical contact wires (7) is lead through an opening of the conversion element.

11. A light source according to claim 1, characterized in that several electroluminescent devices are arranged in arrays.

12. A light source according to claim 1, further comprising at least one optical element for mixing the primary and the secondary light.

13. A light source according to claim 12, characterized in that the optical element can be a mixing rod made of transparent material, or a collimator, or a lens.

* * * * *